(12) United States Patent
Kimura et al.

(10) Patent No.: US 6,660,553 B2
(45) Date of Patent: Dec. 9, 2003

(54) SEMICONDUCTOR DEVICE HAVING SOLID-STATE IMAGE SENSOR WITH SUPPRESSED VARIATION IN IMPURITY CONCENTRATION DISTRIBUTION WITHIN SEMICONDUCTOR SUBSTRATE, AND METHOD OF MANUFACTURING THE SAME

(75) Inventors: Masatoshi Kimura, Tokyo (JP); Yasuyuki Endo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/232,416

(22) Filed: Sep. 3, 2002

(65) Prior Publication Data

US 2003/0173585 A1 Sep. 18, 2003

(30) Foreign Application Priority Data

Mar. 12, 2002 (JP) ........................................ 2002-066283

(51) Int. Cl.$^7$ ............................................... H01L 21/00
(52) U.S. Cl. ........................... 438/48; 438/57; 438/237
(58) Field of Search ............................. 438/57, 59, 63, 438/200, 237, 301, 302, 305, 306, 307, 48

(56) References Cited

U.S. PATENT DOCUMENTS 5,625,210 A * 4/1997 Lee et al. ..................... 257/292
5,880,495 A * 3/1999 Chen .......................... 257/233

OTHER PUBLICATIONS

Shunsuke Inoue, et al. "A 3.25 M–pixel APS–C size CMOS Image Sensor", ITE Technical Report, vol. 25, No. 28, Mar. 2001, pp. 37–41.

* cited by examiner

Primary Examiner—Phat X. Cao
Assistant Examiner—Theresa T. Doan
(74) Attorney, Agent, or Firm—Oblon, Spivak, McClelland, Maier & Neustadt, P.C.

(57) ABSTRACT

Photolithography is used to form a photoresist (30) having an opening over an end portion of a gate structure (15) and over a region adjacent to the gate structure (15) where a photodiode (18) is to be formed. Next, using the photoresist (30) as an implantation mask, vertical implantation of N-type impurities (31) such as phosphorus is performed at an energy of 300 to 600 keV and a dose of 1E12 to 1E14 ions/cm$^2$, thereby forming an N-type impurity-introduced region (17) in an upper surface of a P well (11). At this time, the N-type impurities (31) can penetrate through the gate structure (15) to enter into the P well (11), allowing the N-type impurity-introduced region (17) to be also formed under the gate structure (15).

2 Claims, 5 Drawing Sheets

F I G. 5
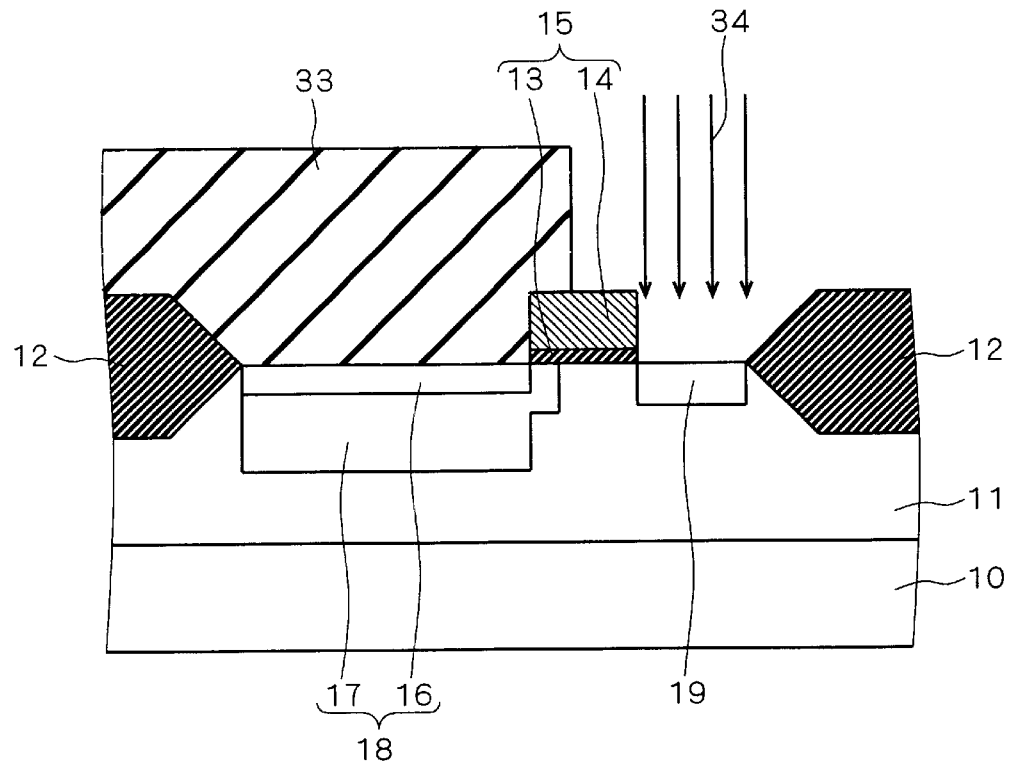

US 6,660,553 B2

1

SEMICONDUCTOR DEVICE HAVING SOLID-STATE IMAGE SENSOR WITH SUPPRESSED VARIATION IN IMPURITY CONCENTRATION DISTRIBUTION WITHIN SEMICONDUCTOR SUBSTRATE, AND METHOD OF MANUFACTURING THE SAME

BACKGROUND OF THE INVENTION

1. Field of the Invention

The present invention relates to a method of manufacturing a semiconductor device and a structure thereof, and more particularly to a method of manufacturing a solid-state image sensor and a structure thereof.

2. Description of the Background Art

FIG. 6 is a circuit diagram showing the structure of a pixel of a conventional CMOS image sensor (cf. S. Inoue et al., "A 3.25 M-pixel APS-C size CMOS Image Sensor", ITE Technical Report, Vol.25, No.28, pp.37–41). As shown in FIG. 6, a pixel of the CMOS image sensor includes a photodiode 101, a transfer MOS transistor 102 for transferring all of electrons generated in the photodiode 101 to a node FD, a reset MOS transistor 103 for resetting the potentials of the photodiode 101 and the node FD, a source follower MOS transistor 104 for amplifying the potential of the node FD and a select MOS transistor 105 for selecting a line to be read out.

The photodiode 101 has its cathode connected to the source of the transfer MOS transistor 102. The transfer MOS transistor 102 has its drain connected to both the source of the reset MOS transistor 103 and the gate of the source follower MOS transistor 104 through the node FD. The reset MOS transistor 103 has its drain connected to a power supply for supplying a predetermined power supply potential VDD.

An operation of the conventional CMOS image sensor will be described now. First, gate voltages Vt and Vres are applied to turn on the transfer MOS transistor 102 and the reset MOS transistor 103, allowing the potentials of the photodiode 101 and the node FD to be reset at the power supply potential VDD. Upon completion of the reset, the application of the gate voltage Vres is stopped to turn off the reset MOS transistor 103.

Next, all of electrons generated by photoelectric conversion of incident light in the photodiode 101 are transferred to the node FD by the transfer MOS transistor 102. The potential of the node FD varies in accordance with the amount of electrons as transferred. Next, a gate voltage Vsel is applied to turn on the select MOS transistor 105. The potential of the node FD as varied is amplified by the source follower MOS transistor 104 to be input to a post-stage readout circuit.

FIG. 7 is a cross-sectional view showing part of the structure of the conventional CMOS image sensor in which the photodiode 101 and the transfer MOS transistor 102 are formed, although illustration of an interlayer insulation film and metallic interconnection is omitted. A P well 111 is formed in an upper surface of the N-type semiconductor substrate 110. An element isolating insulation film 112 is formed on an upper surface of the P well 111. In an element forming region defined by the element isolating insulation film 112, a gate structure 115 having a gate insulation film 113 and a gate electrode 114 laminated in this order is formed on the upper surface of the P well 111.

In the element forming region, a $P_+$-type impurity-introduced region 116, an N-type impurity-introduced region 117 and an $N^+$-type impurity-introduced region 119 are formed in the upper surface of the P well 111. The N-type impurity-introduced region 117 is formed deeper than the $P^+$-type impurity-introduced region 116. The N-type impurity-introduced region 117 and the $P^+$-type impurity-introduced region 116 constitute a photodiode 118, which corresponds to the photodiode 101 shown in FIG. 6. Specifically, the anode and cathode of the photodiode 101 shown in FIG. 6 correspond to the $P^+$-type impurity-introduced region 116 and the N-type impurity-introduced region 117 shown in FIG. 7, respectively.

Part of the N-type impurity-introduced region 117 (i.e., an end portion on the side of the $N^+$-type impurity-introduced region 119) extends under the gate structure 115. The $N^+$-type impurity-introduced region 119 is opposite to the N-type impurity-introduced region 117 with a channel-forming region under the gate structure 115 interposed therebetween. The gate structure 115, the N-type impurity-introduced region 117 and the $N^+$-type impurity-introduced region 119 constitute an MOS transistor (hereinafter referred to as "MOS transistor X"), which corresponds to the transfer MOS transistor 102 shown in FIG. 6. Specifically, the gate, source and drain of the transfer MOS transistor 102 shown in FIG. 6 correspond to the gate electrode 114, the N-type impurity-introduced region 117 and the $N^+$-type impurity-introduced region 119 shown in FIG. 7, respectively. The $N^+$-type impurity-introduced region 119 also corresponds to the node FD shown in FIG. 6.

FIG. 8 is a cross-sectional view showing an example of a step of forming the N-type impurity-introduced region 117. The gate structure 115 has already been formed on the upper surface of the P well 111. Although not shown in FIG. 8, a resist pattern is also formed which has an opening over a region where the N-type impurity-introduced region 117 is to be formed. As described above, part of the N-type impurity-introduced region 117 needs to be formed extending under the gate structure 115. Thus, when forming the N-type impurity-introduced region 117, ion implantation of N-type impurities 120 is performed obliquely with respect to the upper surface of the P well 111 while rotating a wafer. The N-type impurities 120 are therefore implanted also under the end portion of the gate structure 115. Such ion implantation performed obliquely while rotating a wafer is hereinafter referred to as "oblique-rotating implantation" in the present specification.

FIG. 9 is a cross-sectional view showing another example of a step of forming the N-type impurity-introduced region 117. First, N-type impurities are ion-implanted into the P well 111 from the vertical direction with respect to the upper surface of the P well 111 using the gate structure 115 and the aforementioned resist pattern as an implantation mask, thereby forming an N-type impurity-implanted region 122. Such ion implantation performed vertically is hereinafter referred to as "vertical implantation" in the present specification. Next, heat treatment is performed excessively as compared to a normal annealing which activates impurities after ion implantation, resulting in excessive thermal diffusion of the N-type impurities in the N-type impurity-implanted region 122. This causes the N-type impurity-implanted region 122 to extend outwardly and isotropically, so that the consequently obtained N-type impurity-introduced region 117 partly extends under the end portion of the gate structure 115.

The above-described method of manufacturing the conventional semiconductor device has the following disadvantages in the step of forming the N-type impurity-introduced region 117.

As shown in FIG. 8, the gate electrode 114 actually has a tapered shape. In oblique implantation, the concentration distribution of the N-type impurity-introduced region 117 in the P well 111 varies in accordance with angle A of the taper.

Further, in forming the resist pattern, RCA cleaning may previously be performed in many cases for promoting resist adhesion. A wet process performed at that time may cause an end portion 121 of the gate insulation film 113 to be removed. The concentration distribution of the N-type impurity-introduced region 117 in the P well 111 also varies in accordance with the degree of removal of the end portion 121 of the gate insulation film 113.

Such variations in the concentration distribution of the N-type impurity-introduced region 117 in the P well 111 not only cause variations in properties of the photodiode 118 but also sometimes cause a potential barrier to occur immediately under the gate electrode 114, worsening the charge transfer efficiency of the transfer MOS transistor 102, which disadvantageously causes performance degradation of the CMOS image sensor itself.

Further, the angle A of the taper of the gate electrode 114 may vary in a wafer surface, resulting in another disadvantage that a general ion implantation apparatus of a wafer scan type cannot be used, but a special one of a type that performs scanning in a minute region has to be used.

On the other hand, with the method shown in FIG. 9, excessive thermal diffusion of impurities implanted into the P well 111 occurs not only in the transfer MOS transistor 102 but also in other transistors such as the select MOS transistor 105 and the reset MOS transistor 103. This arises a disadvantage that the space between paired source and drain regions of the above-mentioned other transistors are reduced, which is likely to cause punch-through. One method of avoiding such inconveniences could be increasing the gate length in size to preset the space between source and drain regions wide in the aforementioned other transistors. However, this method gives rise to another disadvantage that the density is reduced.

SUMMARY OF THE INVENTION

An object of the present invention is to provide a method of manufacturing a semiconductor device and a structure thereof, capable of providing an impurity-introduced region of a photodiode partly formed under a gate electrode without performing oblique-rotating implantation or excessive thermal diffusion.

According to a first aspect of the present invention, the method of manufacturing a semiconductor device includes the following steps (a) through (f). The step (a) is to prepare a substrate. The step (b) is to form a gate structure on a main surface of the substrate. The step (c) is to form a mask member having an opening over an end portion of the gate structure and over a specified region of the main surface adjacent to the end portion. The step (d) is to implant impurities from an almost vertical direction with respect to the main surface using the mask member as an implantation mask under conditions that the impurities can penetrate through a film thickness of the gate structure, thereby forming a first impurity-introduced region of a first conductivity type functioning as one electrode of a photodiode in the main surface under the end portion and in the specified region. The step (e) is to form a second impurity-introduced region of a second conductivity type functioning as the other electrode of the photodiode in the specified region. The step (f) is to form a third impurity-introduced region of the first conductivity type in the main surface to be opposite to the first impurity-introduced region with the gate structure interposed therebetween.

The first impurity-introduced region can be formed without performing oblique-rotating implantation or excessive thermal diffusion, allowing the impurity-introduced region to have less variations in the concentration distribution.

According to a second aspect of the invention, a semiconductor device includes a substrate, a photodiode formed in a main surface of the substrate and a transistor configured to transfer carriers generated in the photodiode. The photodiode has a first impurity-introduced region of a first conductivity type formed in the main surface, functioning as one electrode of the photodiode and a second impurity-introduced region of a second conductivity type formed in the main surface deeper than the first impurity-introduced region, functioning as the other electrode of the photodiode. The transistor includes a gate structure formed on the main surface, a first source/drain region formed with an end portion of the second impurity-introduced region extending into the main surface under the gate structure, and a second source/drain region being opposite to the first source/drain region with a channel forming region under the gate structure interposed therebetween. The first source/drain region has an impurity concentration distribution only in the depthwise direction of the substrate.

The first source/drain region has the impurity concentration distribution only in the depthwise direction of the substrate and not in a direction across the main surface of the substrate (i.e., the horizontal direction). This can prevent the occurrence of a potential barrier immediately under the gate structure as compared to a semiconductor device including a first source/drain region having the impurity concentration distribution in the horizontal direction, allowing the carrier transfer efficiency to be increased.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 through 5 are cross-sectional views showing a method of manufacturing a semiconductor device according to the preferred embodiment in sequential order of steps;

DESCRIPTION OF THE PREFERRED EMBODIMENTS

Figure 6:
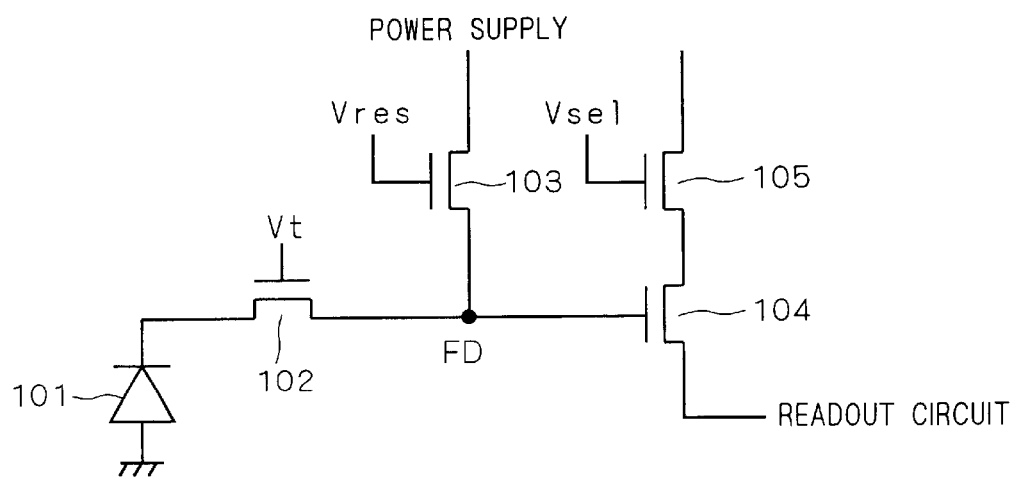
FIG. 6 is a circuit diagram showing the structure of a pixel of a conventional CMOS image sensor.
Figure 7:
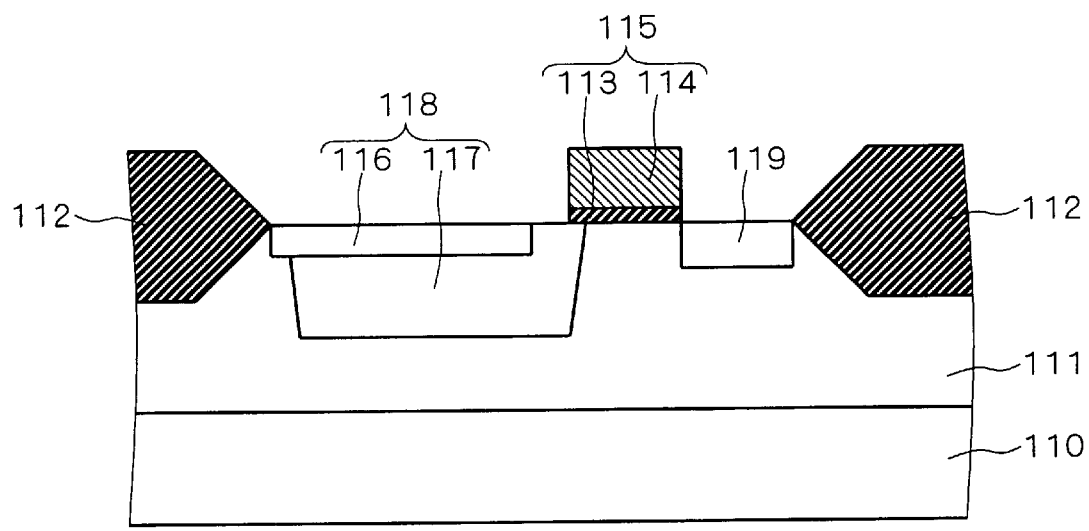
FIG. 7 is a cross-sectional view showing part of the structure of the conventional CMOS image sensor.
Figure 8:
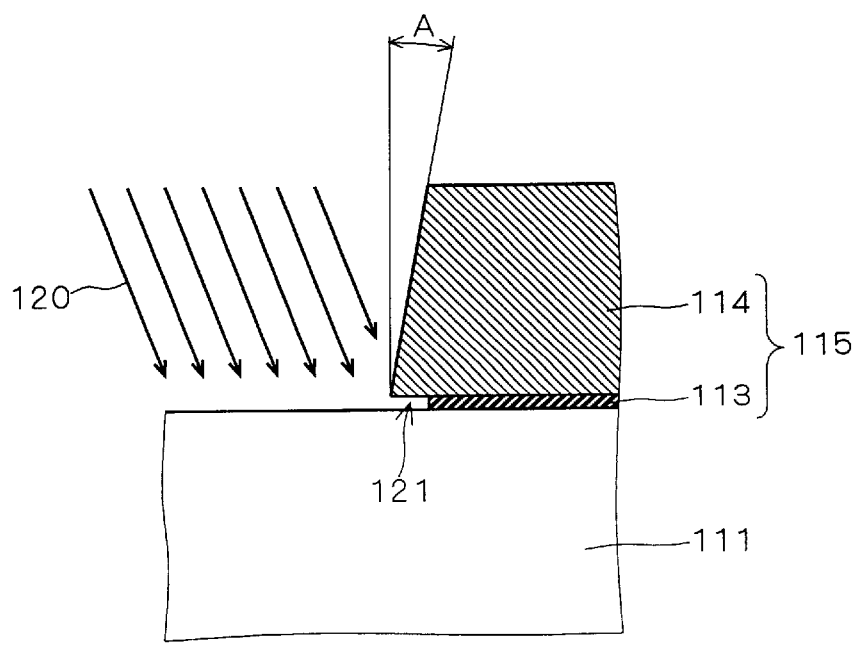
FIG. 8 is a cross-sectional view showing an example of a step of forming an N-type impurity-introduced region.
Figure 9:
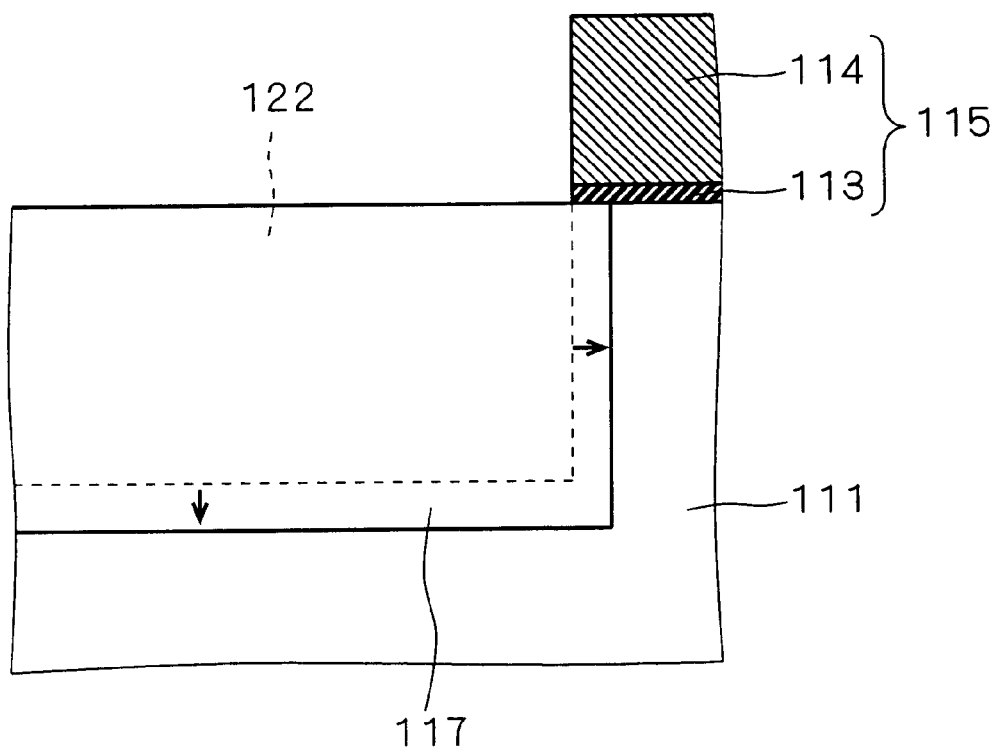
FIG. 9 is a cross-sectional view showing another example of the step of forming the N-type impurity-introduced region.

A pixel of a CMOS image sensor according to a preferred embodiment of the present invention is illustrated by the same circuit diagram as that shown in FIG. 6. Specifically, a pixel of the CMOS image sensor of the present embodiment includes the photodiode 101, the transfer MOS transistor 102, the reset MOS transistor 103, the source follower MOS transistor 104 and the select MOS transistor 105, connected to one another in the same connection relationship as that shown in FIG. 6.

Figure 1:
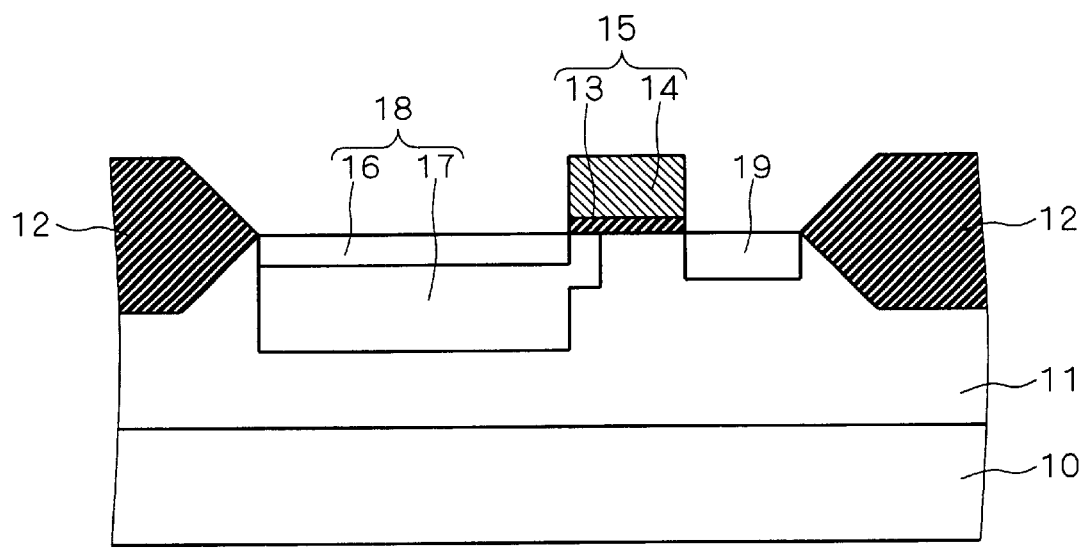
FIG. 1 is a cross-sectional view showing part of the structure of a CMOS image sensor according to a preferred embodiment of the present invention.

FIG. 1 is a cross-sectional view showing part of the structure of the CMOS image sensor of the present embodiment in which the photodiode 101 and the transfer MOS transistor 102 are formed, although illustration of an interlayer insulation film and metallic interconnection is omitted. A P well 11 is formed in an upper surface of an N-type semiconductor substrate 10 made of silicon or the like. A LOCOS-type element isolating insulation film 12 made of a silicon oxide film or the like is formed on an upper surface of the P well 11. In an element forming region defined by the element isolating insulation film 12, a gate structure 15 having a gate insulation film 13 and a gate electrode 14 laminated in this order is formed on the upper surface of the P well 11.

In the element forming region, a $P^+$-type impurity-introduced region 16 and an $N^+$-type impurity-introduced region 19 are formed in part of the upper surface of the P well 11 that is not covered by the gate structure 15. An N-type impurity-introduced region 17 is formed in the upper surface of the P well 11 deeper than the $P^+$-type impurity-introduced region 16. The N-type impurity-introduced region 17 and the $P^+$-type impurity-introduced region 16 constitute a photodiode 18, which corresponds to the photodiode 101 shown in FIG. 6. Specifically, the anode and cathode of the photodiode 101 shown in FIG. 6 correspond to the $P^+$-type impurity-introduced region 16 and the N-type impurity-introduced region 17 shown in FIG. 1, respectively.

Part of the N-type impurity-introduced region 17 (i.e., an end portion on the side of the $N^+$-type impurity-introduced region 19) extends under the gate structure 15. The $N^+$-type impurity-introduced region 19 is opposite to the N-type impurity-introduced region 17 with a channel-forming region under the gate structure 15 interposed therebetween. The gate structure 15, the N+-type impurity-introduced region 19 and part of the N-type impurity-introduced region 17 formed under the gate structure 15 constitute an MOS transistor (hereinafter referred to as "MOS transistor Y"), which corresponds to the transfer MOS transistor 102 shown in FIG. 6. Specifically, the gate, source and drain of the transfer MOS transistor 102 shown in FIG. 6 correspond to the gate electrode 14, the N-type impurity-introduced region 17 and the $N^+$-type impurity-introduced region 19 shown in FIG. 1, respectively. The $N^+$-type impurity-introduced region 19 also corresponds to the node FD shown in FIG. 6.

Figure 2:
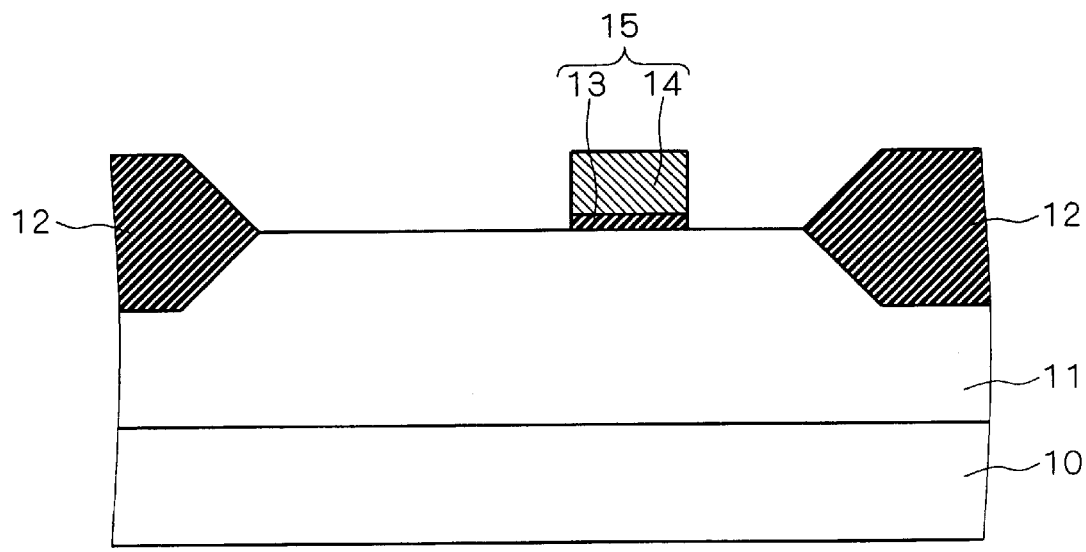

FIGS. 2 through 5 are cross-sectional views showing a method of manufacturing a semiconductor device according to the present embodiment in sequential order of steps. Referring to FIG. 2, the N-type semiconductor substrate 10 is first prepared, following which the P well 11 is formed in the upper surface of the semiconductor substrate 10. Next, the element isolating insulation film 12 is formed on the upper surface of the P well 11. Next, the gate structure 15 is formed on the upper surface of the P well 11. The gate structure 15 has a film thickness (i.e., the sum of the film thicknesses of the gate insulation film 13 and the gate electrode 14) of approximately 200 to 500 nm.

Figure 3:
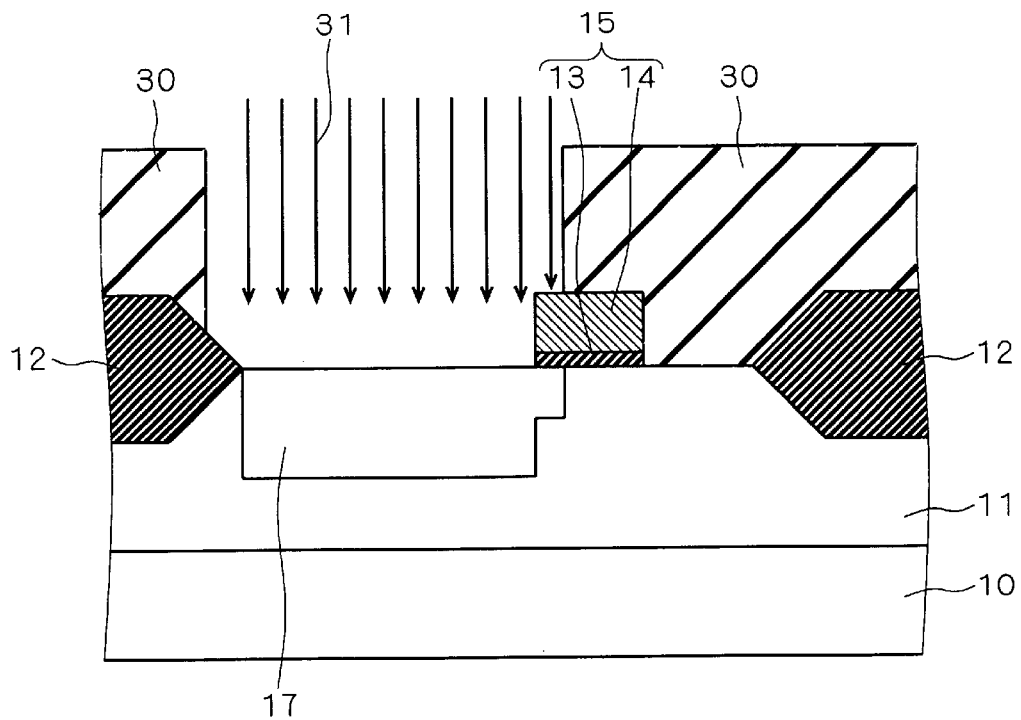

Next, referring to FIG. 3, photolithography is used to form a photoresist 30 having an opening over the end portion of the gate structure 15 and over a region adjacent to the end portion where the photodiode 18 is to be formed. Next, vertical implantation of N-type impurities 31 such as phosphorus is performed at an energy of 300 to 600 keV and a dose of 1E12 to 1E14 ions/cm$^2$ using the photoresist 30 as an implantation mask, thereby forming the N-type impurity-introduced region 17 in the upper surface of the P well 11. With the ion implantation performed at the relatively high energy of 300 to 600 keV, the N-type impurities 31 can penetrate through the gate structure 15 to enter into the P well 11. Thus, the N-type impurity-introduced region 17 is also formed under the gate structure 15 as shown in FIG. 3.

Figure 4:
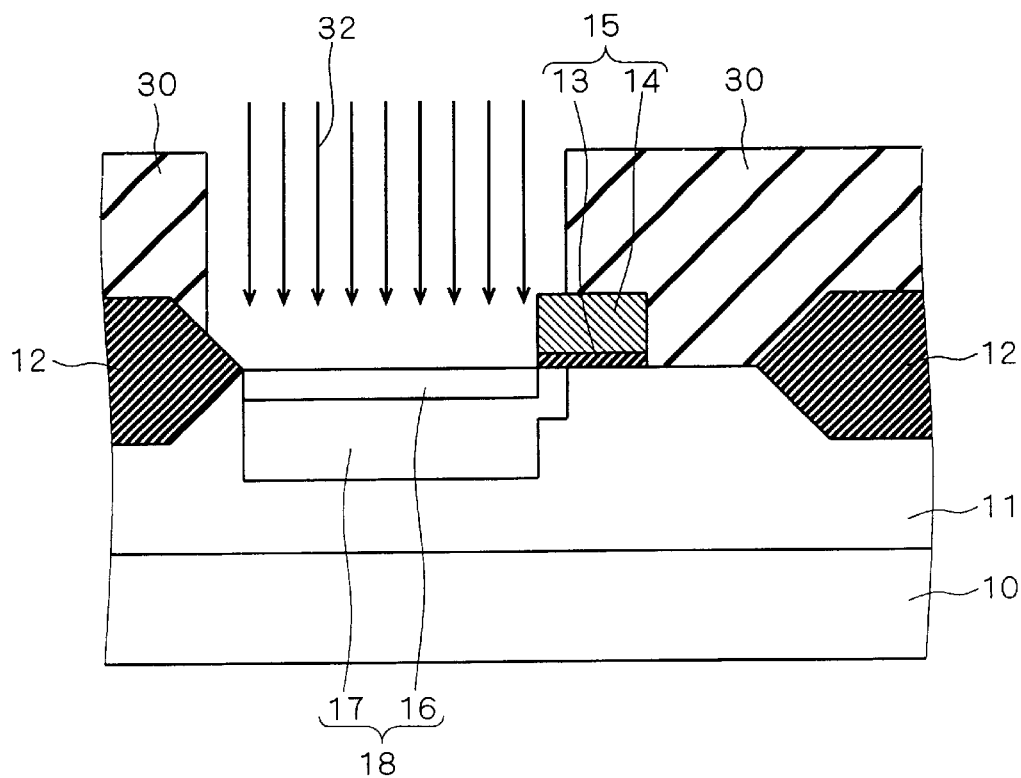

Next, referring to FIG. 4, vertical implantation of P-type impurities 32 such as boron is performed at an energy of 5 to 40 keV and a dose of 1E12 to 5E14 ions/cm$^2$ using the photoresist 30 and the gate structure 15 as an implantation mask, thereby forming the $P^+$-type impurity-introduced region 16 in the upper surface of the P well 11. Thereafter, the photoresist 30 is removed.

Next, referring to FIG. 5, a photoresist 33 having a predetermined opening pattern is formed by photolithography. Next, vertical implantation of N-type impurities 34 is performed under predetermined implantation conditions using the photoresist 33 and the gate structure 15 as an implantation mask, thereby forming the $N^+$-type impurity-introduced region 19. The photoresist 33 is thereafter removed, so that the structure shown in FIG. 1 is obtained.

With the method of manufacturing the semiconductor device of the present embodiment as described above, in the step of forming the N-type impurity-introduced region 17 functioning as the cathode of the photodiode 18 (FIG. 3), vertical implantation of the N-type impurities 31 is performed under such conditions that the impurities 31 can penetrate through the film thickness of the gate structure 15, so that the N-type impurity-introduced region 17 is also formed under the gate structure 15. The N-type impurity-introduced region 17 can thus be formed without performing conventional oblique-rotating implantation or excessive thermal diffusion, allowing the disadvantages encountered in the background art to be avoided.

Further, since the N-type impurities 31 are introduced into the P well 11 by vertical implantation, the concentration distribution in the horizontal direction (i.e., the side-to-side direction of the drawing sheet of FIG. 3) hardly varies in the N-type impurity-introduced region 17 as formed. In short, the impurity concentration distribution does not occur in the horizontal direction. Therefore, the concentration distribution of the N-type impurity-introduced region 17 varies only in the vertical direction (i.e., the top-to-bottom direction of the drawing sheet of FIG. 3) even with variations in the taper angle of the gate electrode 14 or those in the degree of removal of the end portion of the gate insulation film 13 caused by RCA cleaning. This carries another advantage that the concentration distribution is easily optimized by performing simulations or the like.

Furthermore, the N-type impurity-introduced region 17 and the $P^+$-type impurity-introduced region 16 are sequentially formed by ion implantation using the same photoresist 30. This can reduce the number of manufacturing steps as compared to the case of preparing a photoresist separately for the N-type impurity-introduced region 17 and the $P^+$-type impurity-introduced region 16.

Still further, in the semiconductor device according to the present embodiment, part of the N-type impurity-introduced region 17 that functions as the source region of the transfer MOS transistor 102 has the impurity concentration distribution only in the vertical direction and not in the horizontal direction. This can prevent the occurrence of a potential barrier immediately under the gate structure 15 as compared to a semiconductor device in which a source region has the impurity concentration distribution in both the vertical and horizontal directions, allowing the carrier transfer efficiency to be increased.

Needless to say, similar effects can be obtained with N- and P-types in the above description interchanged with each other.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:

(a) preparing a substrate;

(b) forming a gate structure on a main surface of said substrate;

(c) forming a mask member having an opening over an end portion of said gate structure and over a specified region of said main surface adjacent to said end portion;

(d) implanting impurities from an almost vertical direction with respect to said main surface using said mask member as an implantation mask under conditions that said impurities can penetrate through a film thickness of said gate structure, thereby forming a first impurity-introduced region of a first conductivity type functioning as one electrode of a photodiode in said main surface under said end portion and in said specified region;

(e) forming a second impurity-introduced region of a second conductivity type functioning as the other electrode of said photodiode in said specified region; and (f) forming a third impurity-introduced region of said first conductivity type in said main surface to be opposite to said first impurity-introduced region with said gate structure interposed therebetween.

2. The method according to claim 1, wherein in said step (e), impurities are implanted into said specified region using said mask member and said gate structure as an implantation mask to form said second impurity-introduced region.

* * * * *